United States Patent
Thøgersen et al.

(10) Patent No.: US 9,689,754 B2
(45) Date of Patent: Jun. 27, 2017

(54) METHOD AND APPARATUS FOR ESTIMATING THE TEMPERATURE OF A SEMICONDUCTOR CHIP

(76) Inventors: Paul Bach Thøgersen, Aalborg Øst (DK); Bjørn Rannestad, Aalborg (DK)

( * ) Notice: Subject to any disclaimer, the term of this patent is extended or adjusted under 35 U.S.C. 154(b) by 0 days.

(21) Appl. No.: 14/343,413

(22) PCT Filed: Aug. 13, 2012

(86) PCT No.: PCT/EP2012/065805
§ 371 (c)(1),
(2), (4) Date: Mar. 7, 2014

(87) PCT Pub. No.: WO2013/034400
PCT Pub. Date: Mar. 14, 2013

(65) Prior Publication Data
US 2014/0212289 A1 Jul. 31, 2014

Related U.S. Application Data

(60) Provisional application No. 61/534,660, filed on Sep. 14, 2011.

(30) Foreign Application Priority Data

Sep. 7, 2011  (EP) .................................... 11180313

(51) Int. Cl.
*G01K 7/01* (2006.01)
*G01K 13/00* (2006.01)
(Continued)

(52) U.S. Cl.
CPC .......... *G01K 13/00* (2013.01); *F03D 11/0091* (2013.01); *G01K 7/01* (2013.01);
(Continued)

(58) Field of Classification Search
CPC ... H03K 3/42; G01K 7/00; G01K 7/01; H01L 27/0248; H02H 5/04; H02H 5/044
(Continued)

(56) References Cited

U.S. PATENT DOCUMENTS 4,730,228 A * 3/1988 Einzinger et al. ............ 361/103
5,049,961 A * 9/1991 Zommer et al. ............... 257/470
(Continued)

FOREIGN PATENT DOCUMENTS

CN      101438030      5/2009
DE      10351843 A1      6/2005
(Continued)

OTHER PUBLICATIONS

P. Cova et al., *Microelectron Reliab.*, "Thermal Characterization of IGBT Power Modules," vol. 37, No. 10/11, pp. 1731-1734, 1997.

*Primary Examiner* — Gail Kaplan Verbitsky
(74) *Attorney, Agent, or Firm* — Dinsmore & Shohl LLP; Weston R. Gould (57) ABSTRACT

The invention regards a method for estimating the temperature of a semiconductor chip accommodated in a power semiconductor device in operation, such as an IGBT power module, the method comprising the steps of; while the power semiconductor device is in operation determining a voltage drop over the power semiconductor device for a value of applied load current and; estimating the temperature of the semiconductor chip by evaluating the relationship between the determined voltage drop and the value of applied load current on the basis of a semiconductor chip temperature model. The invention also regards the corresponding apparatus for estimating the temperature of a semiconductor chip, as well as a wind turbine comprising such an apparatus.

19 Claims, 6 Drawing Sheets

(51) Int. Cl.
*G01K 15/00* (2006.01)
*H01L 23/34* (2006.01)
*F03D 11/00* (2006.01)

(52) U.S. Cl.
CPC .............. *G01K 15/00* (2013.01); *H01L 23/34* (2013.01); *H01L 2924/0002* (2013.01)

(58) Field of Classification Search
USPC ....... 327/376, 377, 512, 513, 109, 365, 378; 702/99, 130, 132, 133, 134, 135; 374/152–153, 178, 1, 141; 307/140; 361/103, 93.8
See application file for complete search history.

(56) References Cited

U.S. PATENT DOCUMENTS

| | | | |
|---|---|---|---|
| 5,237,481 A * | 8/1993 | Soo et al. | 361/103 |
| 5,352,956 A * | 10/1994 | Doss | 315/224 |
| 5,927,853 A * | 7/1999 | Christiaens et al. | 374/43 |
| 6,729,891 B2 * | 5/2004 | Egan et al. | 439/79 |
| 7,279,954 B2 * | 10/2007 | Throngnumchai et al. | 327/512 |
| 7,507,023 B2 * | 3/2009 | Oyabe et al. | 374/178 |
| 7,988,354 B2 * | 8/2011 | Jansen | 374/170 |
| 8,563,903 B2 * | 10/2013 | Kim et al. | 219/494 |
| 2001/0026576 A1 | 10/2001 | Beer et al. | |
| 2009/0121706 A1 | 5/2009 | Ante et al. | |
| 2010/0046123 A1 * | 2/2010 | Fukami | 361/18 |
| 2010/0157542 A1 * | 6/2010 | Choi et al. | 361/717 |
| 2011/0018607 A1 * | 1/2011 | Kim et al. | 327/478 |
| 2011/0188204 A1 | 8/2011 | Horiuchi et al. | |

FOREIGN PATENT DOCUMENTS

| | | | |
|---|---|---|---|
| EP | 1983640 A2 | | 10/2008 |
| JP | 2000253674 A | * | 9/2000 |
| JP | 2007336728 A | * | 12/2007 |
| WO | WO 2009058695 A2 | * | 5/2009 |

* cited by examiner

//\# METHOD AND APPARATUS FOR ESTIMATING THE TEMPERATURE OF A SEMICONDUCTOR CHIP

REFERENCE TO RELATED APPLICATIONS

This application is the U.S. National Phase of PCT/EP2012/065805, filed Aug. 13, 2012, which claims priority to European Patent Application No. 11180313.6, filed Sep. 7, 2011, and to U.S. Provisional Patent Application No. 61/534,660, filed Sep. 14, 2011, the contents of which are incorporated herein in their entirety.

FIELD OF INVENTION

The invention relates to a method for estimating the temperature of a semiconductor chip accommodated in a power semiconductor device in operation, such as an IGBT power module.

BACKGROUND OF THE INVENTION

Power semiconductor devices, also known as power devices, are known in the art and used as switches or rectifiers in power electronic circuits. In wind turbines, power semiconductor devices can be used to connect the generator with the grid. In some wind turbines power converters (comprising semiconductor devices) controls the power flow to the grid.

Power devices comprises, at least one semiconductor chip, (also known as a chip) conventionally made from silicon, but can also be made of silicon carbide or any other suitable material. When exerting a power device to a current, the chip will heat due to the internal losses in the chip. This can lead to degeneration of the chip, bondwire liftoffs or any other degeneration or wearout of the power device.

It is known in the art that the temperature of a chip is related to the current and/or the voltage in a power device. In EP 1 983 640 it is disclosed that there is a close connection between the voltage drop over the power device and the temperature.

In DE10351843A1 it is disclosed to determine the temperature of a power semiconductor in an inverter by switching a load current off and on and determining its value. If this lies within a given region the voltage drop at the semiconductor is determined and from this the temperature of the power semiconductor.

The temperature is important for the performance, reliability and end of life time of a chip accommodated in a power device. The temperature should be understood, as both changes in the temperature and the mean value.

SUMMARY OF THE INVENTION

Considering the prior art described above, it is an object of the present invention to provide a method for estimating the temperature of a semiconductor chip accommodated in a power semiconductor device in operation, such as an IGBT power module.

The object can be achieved by means of a method, comprising the steps of while the power semiconductor device is in operation, by means of a measuring circuit, determining a voltage drop over the semiconductor chip for a value of applied load current and estimating the temperature of the semiconductor chip by evaluating the relationship between the determined voltage drop and the value of applied load current on the basis of a temperature model, and wherein the temperature model comprising parameters of at least the semiconductor chip and the measuring circuit, and wherein the parameters, for the relationship between the determined voltage drop and the determined applied load current, are established by establishing a temperature of the power semiconductor device when the power semiconductor device is not in operation, and determining a voltage drop over the semiconductor chip for at least one predetermined current applied.

Thus, the method enables a better and versatile estimation of the temperature of a semiconductor chip (also referred to as chip) in a power semiconductor device (also referred to as power device or power module), during operation of the power device. In the prior art, conventionally the current through the power devices has been used to limit the power device, but by using the chip temperature as a limit it is possible to utilise the chip area better. In other words, the effect of using a temperature limit is that it is possible to use a power device with current limit and/or allowing the current through the power device, at least at times to exceed the current limit. Alternatively, if an extended lifetime is desired the limitations on the temperature can be set to ensure that. Further, it is possible to define overload situations of the power device on basis of the temperature instead of the conventional current measurement. In a preferred embodiment, estimating the temperature of the semiconductor chip is performed while the power device is in operation.

The expression "in operation" should be understood in such a way, that the power semiconductor device is performing the task it is intended for in the system wherein it is installed e.g. as part of an inverter of a power converter. A power semiconductor device can be in operation or not in operation. When in operation, the power semiconductor device controls and/or converts and/or conducts an applied load current in the apparatus where it is installed and when not in operation, the power semiconductor device does not convert/control/conduct a load current (also referred to simply as convert) in the apparatus where it is installed. For example, a power semiconductor device in a power inverter is in operation, when it is actively conducting load current to be converted and is not in operation when it is not actively conducting load current to be converted. As an alternatively to "in operation" one of the following expressions can be used, "in action", "on-line" or "production mode". As an alternative to "not in operation" one of the following expressions can be used, "not in action", "off-line" or "non production mode".

When the power device is not in operation then as time goes the temperature of the semiconductor chip and the power device is becoming more and more equal. Depending on the specific semiconductor chip and power device it is possible to determine a time to wait until the temperature is as equal as desired for the establishing of parameters for the temperature model.

It should be understood that the "load current" is the current which is to be converted or controlled e.g. by the power converter in which the power semiconductor device is accommodated. Hence the load current can origin from the grid, generator, etc. and not necessary a current controlled by e.g. the measuring circuit. This is in contrary to the "predetermined current" which is controlled e.g. by the measuring circuit.

The semiconductor chip temperature model (also referred to as chip temperature model, temperature model or model) describes or evaluates the relationship between the chip temperature, current and voltage. The model uses parameters, which can be constants, in order to relate the values of the temperature, current and voltage. The model can, in one example, be a mathematical formula, where the parameters are constants making it possible to calculate one of the values of temperature, current or voltage when the two other values are known. In another example the model is a computer program, which can be based on numerical analysis; in this case the parameters can be both the constants used in the analysis, the number if iterations and any other requirement which needs to be established before the relationship between the values of the temperature, current and/or voltage can be established. It should be understood, that parameters can in an example refer to only one parameter.

It should be understood that when referring to a power device reference is made to a module comprising one or more semiconductor chips. Each semiconductor chip may be a diode, such as a power silicon or silicon carbide diode, or a switch, such as a MOSFET, IGBT, GTO, IGCT, thyristor or a silicon carbide switch.

A semiconductor chip may comprise more than one diode or more than one switch. Alternatively more than one semiconductor chip may together perform the functionality of a switch or a diode.

Further a plurality of semiconductor chips may be gathered in one or more semiconductor chip modules of the power device. In such configuration when estimating parameters or performing measurements, this may be done on one or more of the one or more semiconductor chip module hence the parameters and measurements may then be seen as an average of the semiconductor chips of the semiconductor module. For simplicity the description below will related to one semiconductor chip understanding that the description is also true in a configuration using one or more semiconductor chips in a module, or modules in parallel.

In case of a wind turbine, the knowledge of the chip temperature can for example ensure an increased yield, in a secure manner, due to a possible estimated temperature feedback control of the power converter comprising one or more power semiconductor devices.

The semiconductor chip temperature model comprises parameters which are established by, establishing the temperature of the power semiconductor device or if possible preferred over the semiconductor chip, determining the voltage drop over the power semiconductor device or if possible preferred over the semiconductor chip for at least one predetermined current applied. Both the temperature and the voltage drop are established or determined when the power semiconductor device is not in operation. The establishing of the relationship between the temperature, the determined voltage drop and the determined applied current may be done in a separate operation in a separate location. The parameters which are established while the power semiconductor device is not in operation are used as reference data to the measurements which is made while the semiconductor device is in operation to estimate the temperature of preferably the semiconductor chip or alternatively the power device.

Power semiconductor device including the semiconductor chip wearout, due to mechanical and thermal stress for example degeneration of the chip material, solder cracks, bondwire lift-offs and so on. This wearout alters the relationship between temperature, voltage and current. The method according to the invention can compensate for the wearout, because the parameters of the semiconductor chip temperature model can be updated and thereby be replaced as often as possible with more accurate parameters. Further, if a power module comprising a power device is controlled based on the temperature estimated by the method according to the invention, the method can compensate for wear during the entire lifetime of the power module.

In a power device, one or more thermal stacks with one or more semiconductor chips thermally connected to a baseplate can be present, the connection can be secured by isolation, solder or another suitable connection. Further structural possibilities for thermal stacks in a power semiconductor device are known in the art. For example, the thermal stack can be made without a baseplate. The baseplate can be made from copper or AlSiC and connected to a heat sink, such as a liquid cooling system. As there is a temperature gradient in the thermal stack when the power device is in operation, the temperature of the chip is not identical to the temperature of the liquid or the base plate. Therefore it is an advantage to perform the voltage measuring, in order to establish the parameters of the temperature model, when the temperature is known and when the power device is not in operation. This is because the temperature gradient in the thermal stack is minimal when the power semiconductor device is not in operation as no heat is produced in the semiconductor chip of the power device.

It should be mentioned that it is possible to control the temperature of the power device, when the power device is not in operation. This can be done e.g. by heating (or cooling) the liquid of the cooling system to a predetermined temperature. In this way after a while the power device including the semiconductor chip will obtain the same temperature as the cooling liquid or at least a temperature relative to the cooling liquid which can be calculated or found based on laboratory tests.

Alternatively the temperature can be measured by a temperature sensor.

Preferably, the at least one parameter of the temperature model is established a plurality of times during the lifetime of the power semiconductor device. The at least one parameter can for example be established anytime the power device is not in operation and there is time for establishing the at least one parameter. In another example, the at least one parameter can be established by deliberately taking one of a plurality of power device of a power converter out of operation. The at least one parameter may also be established more and more frequently as the expected end of life time approaches. This is preferred, as the wearout of the power device increases when the end of life time approaches, which affects the relationship between the temperature, voltage and current.

It should be mentioned that the parameters are preferably temperature related parameters, such parameters are known by the person skilled in the art.

In an embodiment, the temperature model further comprising parameters of the gate drive of the power semiconductor device. By including the parameters from the power device, semiconductor chip, measuring circuit and gate drive of the power device it is possible to monitor if any of these components are drifting. In this way it is not only the semiconductor chip of the power device which is monitored it is the entire system including power device and measuring circuit. It should be mentioned that it is possible to include other components than the above mentioned if necessary.

Because the size of the voltage drop is very small (often measured relative changes in millivolt) it is important to use the correct parameters in the temperature model. The more sources contributing to uncertainties in the measurement the more uncertain the temperature estimation is going to be. Therefore it is advantageous, when establishing the parameters of the temperature model, to include as many such sources as possible. This should of cause be balanced with the difficulties of including such sources. The gate drive for the power device is such source if for an example the voltage controlling a chip is 14.9 volt instead of 15 volt an error is introduced to the temperature estimation. This is only one example of the importance of the calibration routine for establishing parameters for the temperature model.

Therefore, in order to reduce the complexity of the temperature model, a calibration with all relevant in-circuit components being present, reduces the uncertainty of the model. By relevant in-circuit components should be understood components relevant for the circuit (application) or power device of which the temperature is to be estimated. I.e. in one application the gate drive of the power semiconductor chip may be relevant to include while it is not included in other application. Other in-circuit components can be e.g. measuring circuit including gate drive, semiconductor chip, etc. The temperature model should still include all relevant elements for temperature estimation, but the uncertainties in the model should be drastically reduced due to the calibration strategy.

In an embodiment, the chip temperature model describes an ideal diode. The relation between the temperature, voltage and the current can be described by the diode law here the current is a function, preferably a linear function, of $e^{(aV/T)}$. Where a is a constant and V is the voltage drop over the power device or preferably over the semiconductor chip and T is the temperature. By using a model for an ideal diode it is relatively simple to obtain a temperature estimate when the implementation of the semiconductor chip is a diode.

In another embodiment, the chip temperature model describes a thermistor. The relation between the temperature, voltage and the current can be described by Ohm's law, where the change in temperature is proportional with the change in resistance.

Preferably, the chip temperature model describes a combination of an ideal diode and a thermistor. The combination can be used in such a way, where for small currents the diode law is dominant and for higher currents the thermister model is dominant. Small currents can be under 300, 200, 100 A.

Advantageously, the chip temperature model is at least partly based on data established by test, preferably accelerated tests. This can, for example, be by performing a plurality of tests for establishing the model or in another example the test data is used to establish one or more of the fixed parameters in the model. Accelerated tests can also be used to establish if the model should alter as a function of the wearout of the power device.

Preferably, the estimated temperature is used as basis for determining a derating factor for the load current handled by the power semiconductor device. This can be a way of ensuring better utilisation of the semiconductor chip e.g. a prolonged lifetime or enabling higher load of the power device. By derating factor, is meant that the voltage, current or switching frequency over the power device is diminished by a factor compared to the rated maximum for the power device.

Furthermore, with knowledge of the estimated temperature valuable information in relation to controlling the power device including the semiconductor chip is achieved. With this temperature information it is possible to improve utilisation of the semiconductor chip especially when operating in load areas which is different from worst case. As an example it may be possible to minimise threshold values securing that the semiconductor chip is not overloaded i.e. being able to load the semiconductor chip closer to maximum than without the temperature information. Another example is that it may be possible to load the semiconductor chip harder i.e. "squeeze" more power through the semiconductor chip (even sometimes above the predetermined maximum load) with no or even optimising effect of the life time of the semiconductor chip or semiconductor device or prolonging the life time of the semiconductor chip or semiconductor device at a given load.

The control of the load can be determined based on a lifetime estimating model. The lifetime estimation model estimates the lifetime of the semiconductor chip at a given load/estimated temperature. Hence if the load/temperature change the end life time of the semiconductor chip is changing and the new end of life time can be found by means of the lifetime estimation model.

In the short term if a temperature is estimated to be higher than e.g. a predetermined threshold, this can lead to a temporary derating of the load current handled by the power semiconductor device. Depending on the size of the temperature the derating factor can be chosen. Typically the higher temperature the higher derating factor. When the temperature is back to normal again (below a predetermined threshold) the derating factor or parameter representing it may be reset, set to normal/nominal production.

In addition the load current can be controlled based on the lifetime estimation model and thereby indirectly based on the temperature. Controlling the load current may include derating or increasing the load current of the power semiconductor device and thereby the semiconductor chip(s) according to the desired end of lifetime, production yield or the like. In this way if it is desired to operate a semiconductor switch at a given maximum temperature to obtain a given estimated remaining lifetime, this can lead to a given derating factor of the load current handled by the power semiconductor device.

The lifetime estimation model is built of data e.g. from the individual semiconductor chip or from data from a type of semiconductor switch. Hence a simple lookup table can be part of the lifetime estimation model.

Parameters for the semiconductor chip temperature model are preferably found by running a calibration routine wherein the semiconductor chip temperature is established. In an embodiment, establishing the temperature is performed by determining the temperature of the semiconductor chip accommodated in the power semiconductor device. This temperature is also known as the junction temperature of the chip. This can for example be done by measuring the (established) temperature directly on the power semiconductor chip or another part of the power device, which is in thermic contact with the chip via a temperature sensor.

In an embodiment, establishing the temperature is performed by heating the power semiconductor device to a predetermined temperature, preferably by use of a liquid in thermodynamic contact with the power semiconductor device. This can be done by heating the liquid to any desired temperature, such as 30° C., 40° C., 50° C., 60° C., 70° C., 80° C., which will ensure that the power semiconductor device and thereby the semiconductor chip has the desired temperature when not in operation. An alternative to heating the power semiconductor device is simply to use the actual temperature of the power semiconductor device taken e.g. from the cooling system.

Preferably, establishing the temperature is performed when the power semiconductor device is not in operation. This requires additional time wherein the power semiconductor device is not in operation. On the other hand it makes it possible to have a measurement cycle entirely devoted to determine the voltage drop, which can be initiated when the power device is not in operation. As an example, a calibration routine for calibrating the chip temperature model can be initiated when the power device is not in operation wherein the calibration routine establishes the temperature of the power device and uses those values to establish amended parameters for the chip temperature model.

Advantageously, the power semiconductor device has not been in operation for at least five times the thermal time constant of the thermal stack, when the parameters of said semiconductor chip temperature model is established. This ensures that gradient temperature in the power semiconductor device and/or the stack is minimal.

In an embodiment, the at least one predetermined current is applied for less time than 10% of the thermal time constant for the chip. When determining the voltage drop over the power semiconductor device or preferably over the semiconductor chip, the power device has to be activated and current will go through it. This heats the power device including the semiconductor chip. In order to ensure that the thermal energy does not rise to a level where it will influence significantly on the determining of the voltage drop the current can be applied for a short time only. The short time can be less time than 10% of the thermal time constant for the semiconductor chip, for example, less than 1 millisecond.

In a further aspect, the present invention regards an apparatus for estimating the temperature of a semiconductor chip accommodated in a power semiconductor device in operation, such as an IGBT power module, comprising means for determining a voltage drop over the semiconductor chip for a value of applied current load while the power semiconductor device is in operation, means for estimating the temperature of the semiconductor chip by evaluating the relationship between the determined voltage drop and the value of applied load current on the basis of a temperature model, wherein the apparatus comprises a system for establishing parameters of the temperature model relating to at least the semiconductor chip and the means for estimating the temperature, the system comprises, means for establishing the temperature of the power semiconductor device while the power semiconductor device is not in operation, and means for determining the voltage drop over the semiconductor chip for at least one predetermined current applied, where the current is applied when the power semiconductor device is not in operation, wherein the system is able to establish the parameters of said semiconductor chip temperature model on the basis of the relationship between the determined voltage drop, the determined applied current and the established temperature.

Thus, the apparatus enables advantageous estimation of the temperature of a semiconductor chip accommodated in a power semiconductor device.

In a preferred embodiment, the means for determining a voltage drop over the power semiconductor device preferably over the semiconductor chip for a value of applied load current can determine the voltage drop while the power semiconductor device is in operation. Alternatively or in combination herewith, the means for estimating the temperature of the semiconductor chip by evaluating the relationship between the determined voltage drop and the value of applied load current on the basis of a semiconductor chip temperature model can estimate the temperature while the power semiconductor device is in operation.

The means for determining the voltage drop can be an analog-to-digital converter (ADC).

The system for establishing the parameters of said semiconductor chip temperature model can comprise a unit which can calculate and/or compare data, such as a micro processor.

The means for establishing the temperature can be an active device where the temperature is determined and then the power semiconductor device is either cooled or heated to a desired temperature. It can also be a passive device where the temperature is determined by a temperature sensor.

It is to be understood, that the apparatus can be modified in such a way that it can perform any of the methods described in the claims.

Preferably, the means for determining the voltage drop comprises a measuring circuit, the measuring circuit comprises a low power semiconductor device and at least one gate drive (not relevant for diodes) for the low power semiconductor device, wherein at least part of the means for determine the voltage drop over the semiconductor chip is integrated in the gate drive. A low power semiconductor device will most likely need a gate drive, such a gate drive can comprise; a gate controlling circuit, a switch mode power supply, an interface to control the system through a galvanic isolated barrier or level shift, a shoot through and/or overcurrent protection, a logic to prevent shoot through and minimum dead time generation. To lower the cost of the measuring circuit it can use some of the components of the gate drive, such as the switch mode power supply and/or parts of interface to control the system. Further, the voltage measurement can be used as a de-saturation protection circuit and protect the power module against overcurrent.

In contrary to the high power semiconductor what is also simply referred to as the semiconductor device, the low power semiconductor device is not as such part of the power device converting power. The low power semiconductor device is part of the measuring circuit where it is controlling the current which is used when the high power semiconductor device is tested. Hence the main purpose for the low power semiconductor device is to protect the measuring circuit form high voltage across the high power semiconductor device.

Advantageously, the means for establishing the temperature heats the power semiconductor device to a predetermined temperature, preferably by use of a liquid in thermodynamic contact with the power semiconductor device and thereby the power semiconductor chip. This ensures a simple way of establishing the temperature of the power semiconductor device and thereby of the semiconductor chip.

In an even further aspect, the present invention regards a wind turbine, comprising a power semiconductor device with a semiconductor chip and an apparatus as described above. Using the power device or method described above to estimate the temperature of a semiconductor chip accommodated in a power semiconductor device when the power device is in operation, has several advantages as mentioned above. The temperature estimation can ensure quick response to a failure of a cooling system, thereby preventing malfunction of the power device. In addition, it can be used to optimise the power device by using the estimated temperature as measure for limiting the voltage and/or current through the power device. This can result in a higher allowed current or voltage than the prior art where the limitation is based on a current measurement. Accordingly, there is a clear economic incentive to optimise the performance of the wind turbine on the basis of an estimated temperature according to the invention.

Preferably, the wind turbine further comprises a liquid system in thermodynamic contact with the power semiconductor device, wherein the liquid system comprises means for controlling the temperature of liquid in the liquid system. In one example the means for controlling the temperature of the liquid is a heater, such as an electrical heater. In a second example the liquid passes a heat exchanger, the heat exchanger may be controlled to cool/heat the liquid, this can be by turning off/on the fan on the heat exchanger. In a third example, the valve that controls a bypass valve in the liquid system is controlled.

In an embodiment, the wind turbine control system is operationally connected to a power converter, comprising the power semiconductor device and where the liquid system is operationally connected to the power converter. Preferably, the wind turbine control system is operationally connected to the liquid system. Using the already installed wind turbine control system to perform the steps for estimating the temperature of a chip in a power device of a power converter, lowers the cost for the incorporation of the method for estimating the temperature, of a chip compared to installing a new power device having means for estimating the chip temperature in the wind turbine.

DESCRIPTION OF THE DRAWINGS

In the following, the invention will be described in greater detail with reference to the accompanying drawings.

DETAILED DESCRIPTION OF THE INVENTION

The invention relates to estimating the temperature of a semiconductor chip accommodated in a power semiconductor device when the power semiconductor device is in operation. A power semiconductor device may by an inverter module of a power converter, hence the power semiconductor device typically comprise a plurality of semiconductor switches. The semiconductor chip may be an active switch and/or diode, for example: IGBT, Thyristor, GTO, MOSFET, IGCT, silicon carbide switch, power silicon diodes or power silicon carbide diodes. The method can estimate the steady state and the transient temperature of the chip when the power device is in operation.

Figure 1:
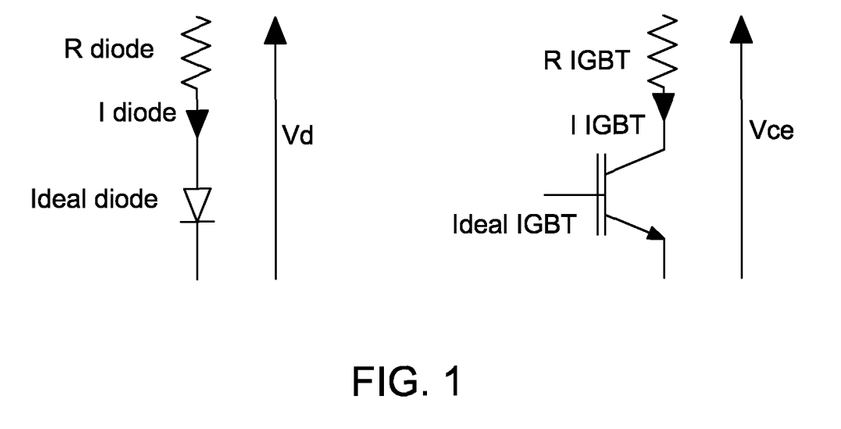
FIG. 1 a schematic view of a diode and a switch
Figure 2:
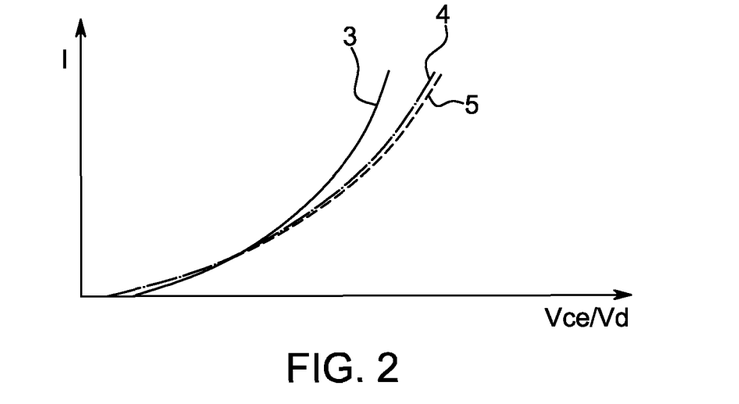
FIG. 2 a graph of the relationship between the current, voltage and temperature FIG. 3 a schematic view of a measuring circuit FIG. 4 a schematic view of power semiconductor stack FIG. 5*a* a graph of a current ramp FIG. 5*b* a graph of voltage measurements FIG. 6*a* a graph of the voltage (Vce) as a function of time FIG. 6*b* a graph of the current (i) as a function of time FIG. 7 a graph of the current and voltage relationship for different temperatures FIG. 8 a schematic flow diagram of an embodiment of the invention FIG. 9 a schematic view of embodiment of the invention in a wind turbine application

When a power device, including one or more semiconductor chips comprising one or more diodes or IGBT switches, is in operation, current flows through it and a voltage drop is generated across the component as shown in FIG. 1. The voltage drop can be divided into a voltage drop across a resistive part and a voltage drop across the PN junction of e.g. an IGBT switch inside the semiconductor chip. Resistance lies in terminals, busbars, bonding wires, chip surface and in the material itself (e.g. Si or SiC). Normally the PN junction has a negative temperature coefficient, while the resistive part has a positive temperature coefficient, which leads to a voltage drop characteristic as shown in FIG. 2. Here an example of a relation between the current (I) and voltage drop can be seen. Vce is the voltage drop over a switch and Vd is the voltage drop over a diode. FIG. 2, graph 3 shows the relation when the power device and thereby the semiconductor chip is cold and graph 4 shows the relation when the power device and thereby the semiconductor chip is warm. This means that when the temperature rises, which occurs when the power device is conducting current, the relationship between the current and the voltage drop alter.

In an embodiment, the estimation method is based on the establishment of parameters, which temporarily establishes the relationship between the current, voltage and temperature of the power device. By temporarily, it is meant that it is possible to replace the parameters with new parameters obtained by the method according to the invention. It is advantageously to make a new establishment of the parameters as often as possible, especially when the power device gets near to the end of lifetime.

Parameters e.g. for a semiconductor switch or a group of semiconductor switches may be found by laboratory test of one or more of the semiconductor switches of that group. Ideally such test should be conducted continuously throughout the lifetime of the semiconductor switch with controlled temperature and e.g. also controlled voltage and current. A test for determining a parameter can be carried out by applying a current at a known temperature and then measure the voltage drop.

To reduce the time to obtain test results accelerated tests may be used. An accelerated test may be carried out by calculating a time in which a known current should be applied. The calculated time and current should reflect a use profile of use of a semiconductor switch in a period of time e.g. the entire lifetime of the semiconductor switch. In this way it is possible to test the semiconductor switch used according to a use profile in its entire lifetime in a few years or even month. The time for the accelerated test may be measured in years, month, days or hours. Of course it must be expected that the test result is more correct the longer the accelerated test is running.

When a power device (including chip(s) which includes switches and/or diodes) is used the internal resistance will increase due to wear. This can be due to solder cracks, surface cracking or bondwire liftoff. When the internal resistance increases then more power will be lost leading to higher temperature. Thus, an increase of resistance will change the current/voltage behaviour; this is shown on FIG. 2. Graph 4 will change to the graph 5 when the power device is worn. In other words, it is possible to estimate the temperature of the chip on the basis of a current/voltage measurement. However, care should be taken with regards to the wearout of the power device as this will affect the temperature estimation. Therefore, the establishment of the parameters can in an embodiment be repeated in order to minimise the deviation of the estimated temperature from the true temperature of the chip, in order to compensate for the wearout.

The Vce or Vd can be measured during operation of the power device and therefore the temperature of the chip can be estimated during operation of the power device.

Figure 3:
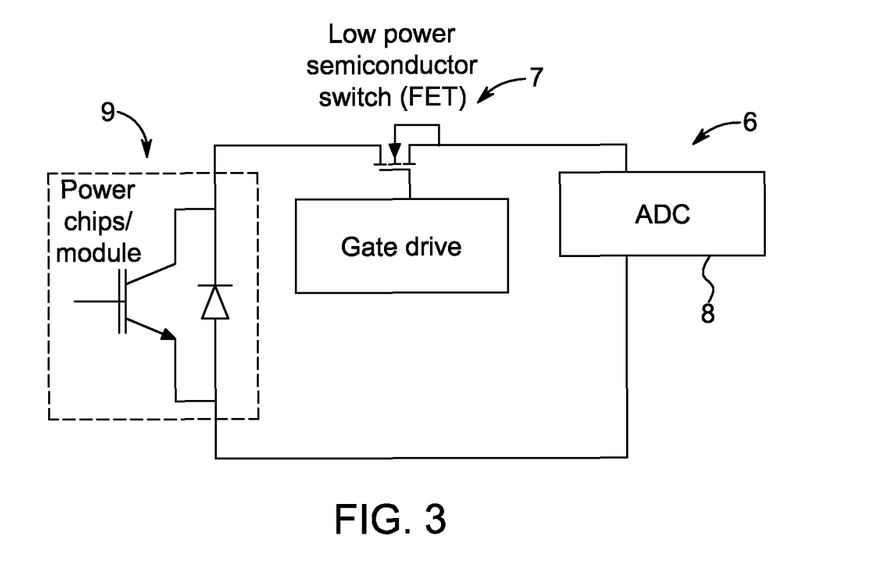

Detecting the voltage drop over the power device preferably over the semiconductor chip can be challenging, because changes in the mV range must be detected while the power device is conducting voltage in the kV range, which is across the power device when it is blocking. An example of a measuring circuit 6 can be seen in FIG. 3. Here a measuring circuit 6 comprises a high voltage, low power semiconductor switch 7, in this case a field-effect transistor (FET). The high voltage, low power semiconductor switch 7 can block the high voltage across the test object 9. The test object is normally one or more semiconductor chips (such as IGBTs or diodes) of the power device. On FIG. 3 is illustrated one IGBT as test object 9 and it should be mentioned that the IGBT is controlled by a gate drive which is not illustrated. The measuring circuit 6 further comprises an Analog to Digital Converter (ADC) 8. When the FET 7 is on, the ADC 8 can detect the voltage drop across the test object 9 and thus across the power device or IGBT. Further, there is shown a gate drive which controls the low power semiconductor 7. It should be noted that any type of semiconductor switches or blocking devices such as diodes, JFET, MOSFET bipolar transistor, IGBT, etc. may be used to block the high voltage across the test object 9 when the test object 9 is in the off state. This is known to the skilled person and will not be described further.

In an embodiment of the invention, the parameters of the model are established at a known chip temperature in this way the established parameters can be used as reference data in the temperature model. In order to do this, at least one measurement of the current and voltage at a determined chip temperature must be established. The temperature model in this embodiment is based on reference data, which can be obtained via passive heating to a determined temperature, this will be described below. The establishment of the parameters must at least partly be done when the power device is not in operation.

Figure 4:
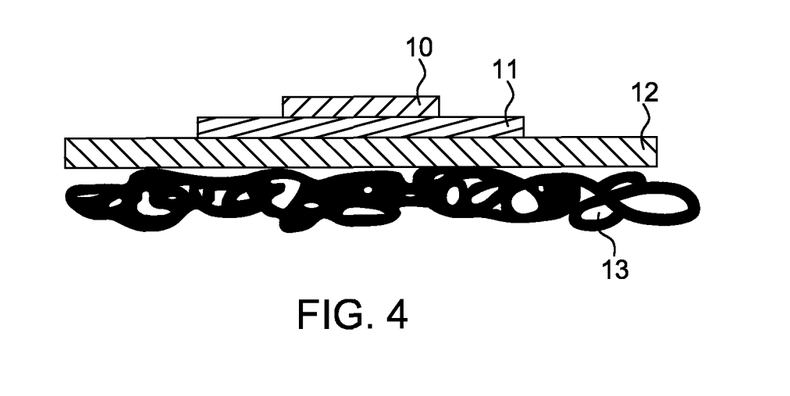

FIG. 4 shows a thermal stack of a power device, with a semiconductor chip 10, a baseplate 12 (e.g. of copper) where between there is a ceramic layer 11 which isolates between the chip 10 and the baseplate 12. A power device can comprise one or more thermal stacks and on each thermal stack more than one semiconductor chip may be located. The baseplate 12 is in contact with a liquid 13 that is part of a cooling circuit for the power device. If no loss has been generated in the chip 10 for some seconds (the power device is not in operation), then the chip 10 temperature is equal (or very close to) the liquid 13 temperature. In other words if no loss has been granted in the chip 10 for a time longer than the thermal time constant, preferably at least two-five times the time constant, the temperature of the chip 10 and the liquid 14 may be close to be the same if not the same. Hence the temperature of the chip 10 can be assumed to be at least substantial the same as the temperature of the power device. This means that the temperature of the chip 10 can easily be determined e.g. via a temperature sensor which measures the liquid temperature. Hereafter the voltage across the IGBT or diode of the chip at a known temperature can be determined by applying a current and measuring the voltage (also referred to as voltage drop). These measurements can be used to establish the parameters of the model. Applying a current will heat the chip and lead to a temperature gradient over the thermal stack, therefore the most reliable data is obtained if the current is only applied for a very short time, such as maximum 100, 200, 300, 500, 1000 microsecond, or maximum 20%, 10% or 5% of the thermal time constant for the chip.

The thermal time constant for the base plate is typically measured in seconds depending on the type of material and thickness of the material. The thermal time constant for the chip is typically less than 1 second and is primly based on chip size.

In one example of a thermal stack as illustrated on FIG. 4 the thermal time constant may be 0.7 second.

If the measuring circuit FIG. 3 is used to perform the method of the invention, a chip temperature model needs to be established. The model describes the relationship between the voltage, current and the temperature. The model can be a numerical model, in which the relationship is determined by characterising an individual semiconductor chip of a specific semiconductor chip type. This characterization can be to measure the current and the voltage for specific temperatures for the individual semiconductor chip; it will then be possible to establish parameters of the model, so that it is possible to determine the temperature on the basis of a voltage and current measurement. When the model and the parameters of the model are established, it can be used to estimate the temperature.

It should be mentioned that it might be sufficient to determine the relationship between voltage, current and temperature of a power device or semiconductor chip module knowing that the temperature model then would be built on average values.

A microprocessor that is programmed according to the model and is communicating with the measuring circuit of FIG. 3 can be an advantage, preferably the microprocessor is establishing the parameters for the model when it was initially installed. When this is done, it is possible to estimate the chip temperature on the basis of a voltage and load current measurement performed when the power device is in operation.

In an embodiment the system needs to make an initial parameter establishment and at later times again determine the parameters to compensate for the wear of the power device. If not compensated for, the method will estimate a higher temperature than the actual temperature when operating at high currents and estimate a lower temperature than actual temperature at low currents. Therefore, a compensation for wear of the power device in this embodiment should be made during the entire lifetime of the power device.

Figure 5:
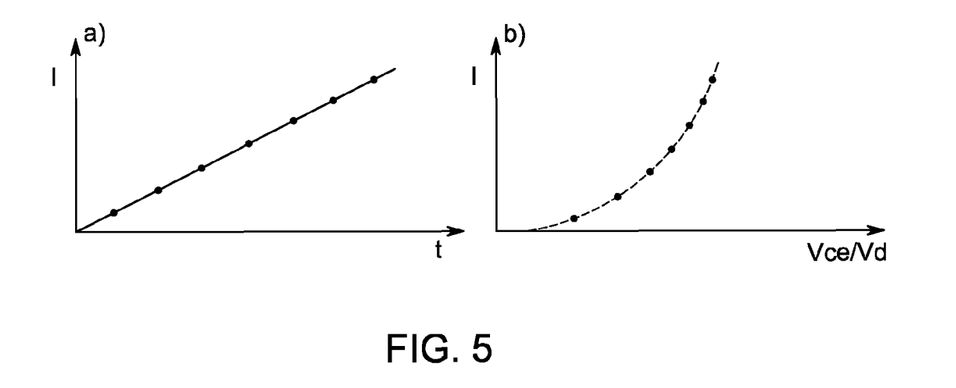

For more precise establishment of the parameters, a current ramp (an example of the predetermined current described above), as seen in FIG. 5 can be used. Here a plurality of increasing currents is applied and corresponding voltage is measured. In FIG. 5a the current (I) and time (t) current ramp can be seen where the dots are actual currents applied and the graph is a fitted line. The current ramp is applied for a very short time to keep the temperature influence at a minimum. In FIG. 5b the voltage (Vce/Vd) measurements can be seen for the applied currents (I) as dots. A line is fitted for the voltage and current relation for a given temperature. Thereby it is possible to establish the relationship between the temperature, current and voltage.

Figure 6:
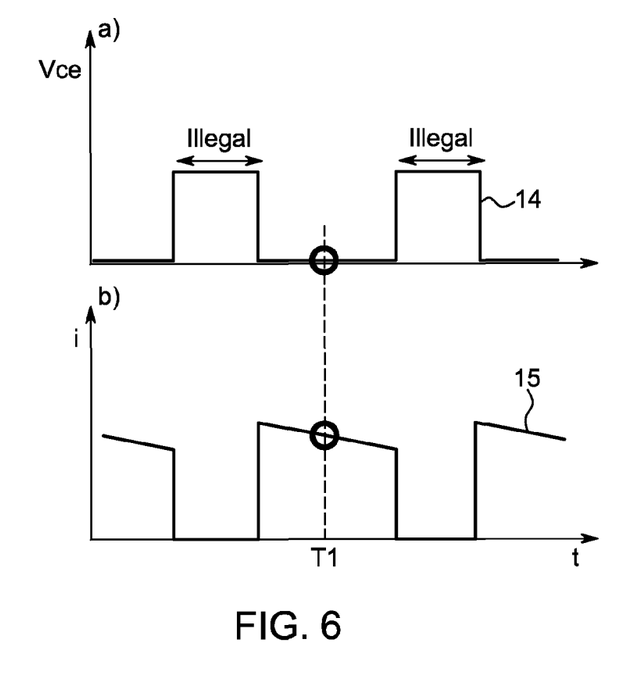

In order to estimate the chip temperature (e.g. the transient chip temperature), for example in the system shown in FIG. 3, the Vce or Vd is measured during normal Pulse Width Modulated (PWM) operation of the power device. Since the FET 7 of the measuring circuit 6 is very fast, the measuring circuit can be connected during the conduction period of the switch, while being off in a high voltage state. On FIG. 6 an example of voltage across an IGBT (Vce graph 14) and load current through the same IGBT (graph 15) in a PWM pattern is shown. The "illegal" zones are defined when the Vce voltage is high (IGBT is off). In these zones the FET 7 of the measuring circuit 6 must also be off. Whenever the IGBT is conducting a load current, a Vce measurement may be made. It is important that both the Vce and the load current through the IGBT is measured at the same time, as an example shown at time T1 in FIG. 6.

In order to get a suitable semiconductor chip temperature model and reference data which can be used to establish the parameters of the chip temperature model, the particular power device has to be characterised. This characterisation has to be performed for each type and setup of power devices i.e. taking into account type of semiconductor chip, measuring circuit components, semiconductor chip gate drive, etc. It can be done by passive heating of the power device, applying a predetermined current and then measure the voltage at the established temperature. This can be done by the method described above to establish the parameters where the cooling liquid is used to control the temperature. As it is conventional to use water as cooling liquid, it is a problem to use at temperatures over 100° C. as the water will boil. As the typical allowable temperature for the chip is over 100° C. (typically 125° C. to 150° C.) the above described method can only characterise part of the temperature range. This can be overcommed by using cooling liquid having a boiling temperature above e.g. 150° C.

Alternatively the characterisation can be made for example by means of an IR-camera or by means of a heat plate. This can characterise the power device over the entire temperature range.

As described above to obtain the most accurate estimation of the temperature it is necessary to take into account all sources from which uncertainties can be introduced. For example it is better to measure the voltage drop directly over the semiconductor chip than measure the voltage over the power device which may comprise a plurality of semiconductor chips.

In practical implementation it is often not possible to obtain the theoretical best measurements and therefore the second best is to be used. One example of a way to obtain parameters for the temperature model is to include all elements of FIG. 3 when measuring/establishing parameters. In this way errors introduced by the different components is averaged. If not all components is included an error or inaccuracy of a component may decrease the quality of the temperature estimation when parameters are established later in time.

It should be mentioned that other components than the once illustrated on FIG. 3 can be included such as the gate drive for the test object 9

In case the present invention is implemented in a power converter of a renewal energy plant such as a wind turbine or solar system temperature models may be made for the individual power stacks of the power converter, for the inverters (grid and rotor side) and the like.

The IR-camera method: A special power device can be manufactured, which is made transparent for IR. It may be completely open, without gel, or with transparent gel. This special power device can be set to run in normal mode or passively heated as described above. By correlating the IR-measured temperatures to actual Vce or Vd measurements the characterisation of the power device can be made. The advantage of the IR characterisation is, that also the temperature difference across the chip and baseplate can be obtained. In order to make an IR characterisation a special-built power module is required.

The Heat plate method: By placing the power device on a heat plate without loading the semiconductor chips, the semiconductor chips will acquire the same temperature as the heat plate. In this passive setup, the current and voltage characteristic of the power device can be determined at the heat plate temperature. The advantage of the heat plate method is that the heating plate can be controlled in a wide temperature span, such as from −25° C. to 150° C.

The actual Vce or Vd data may vary from device to device (or from chip to chip), therefore it may be an advantage to only use the characterisation as a general characterisation of a type of power device. Therefore a specific characterisation/calibration of an individual power device should be made on the actual power device as describe above.

Figure 7:
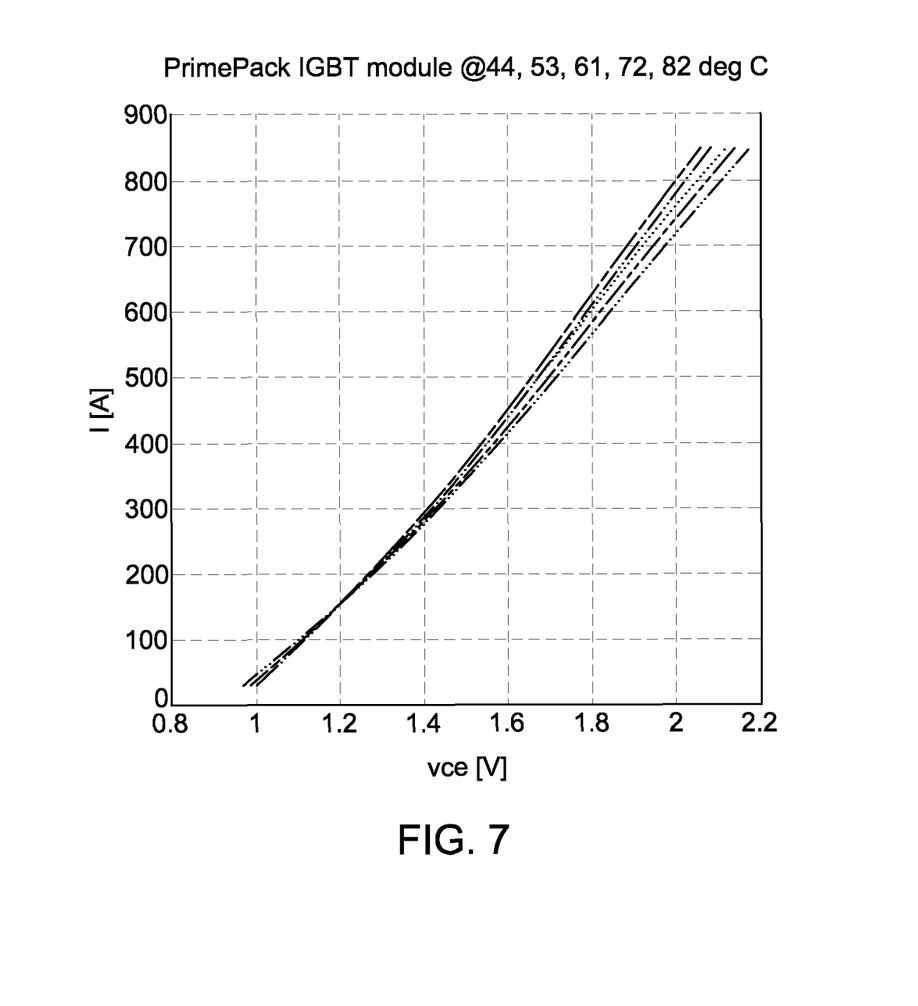

FIG. 7 is an actual characterisation of a power device (in this case a PrimePack IGBT) there are graphs (from left to right at high current/voltage) originating from temperature of 44° C., 53° C., 61° C., 72° C. and 82° C. It can be seen, that the graphs cross each other. At the low voltage before the graphs cross, the voltage current relationship is mostly affected by the diode law, whereas at higher voltage the relationship is governed by the thermistor part of the model. By looking at the graphs on FIG. 7 it can be realised, that when a measurement of the voltage and the value of load current is performed then the temperature can be estimated from the graph.

Figure 8:
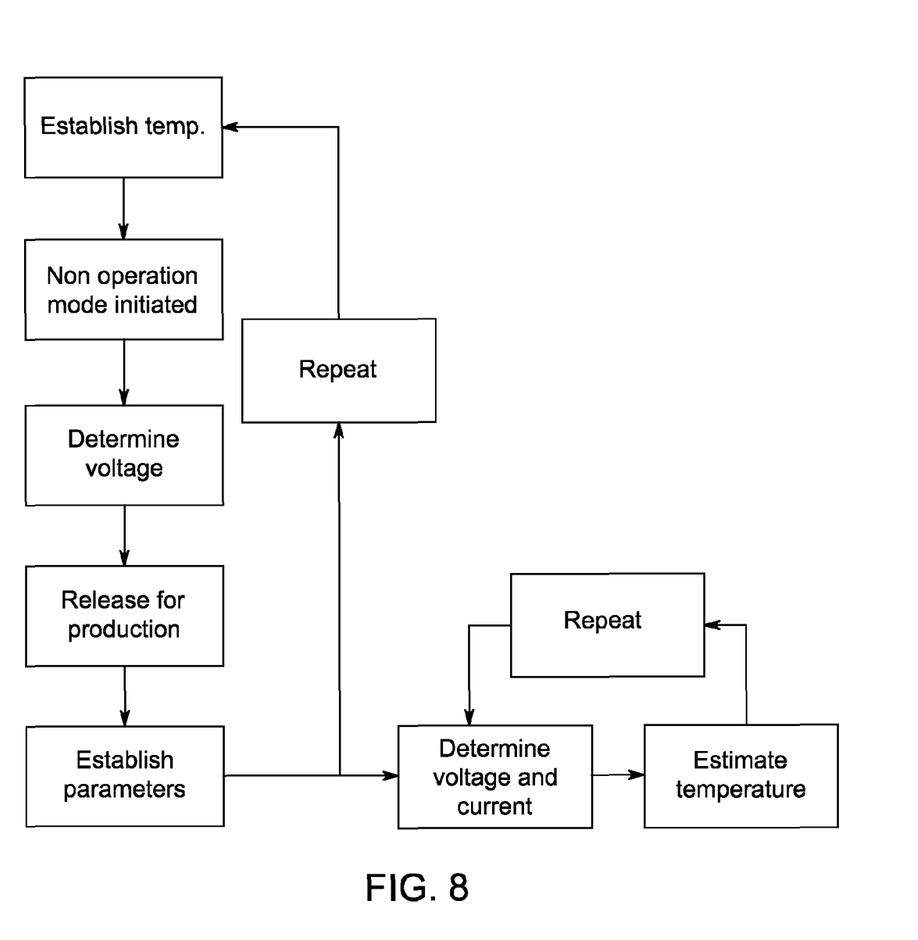

FIG. 8 shows a diagram for an embodiment of the invention where the parameters of the model are also established. In this embodiment the method for estimating the temperature of a semiconductor chip accommodated in a power semiconductor device has been initiated by establishing the temperature (establish temp.) when the power device is not in operation. This can be done as described above either by active liquid control, heating or cooling the cooling liquid, hereby controlling the liquid temperature or measure the temperature by other means, directly or indirectly. Then it is secured that the power device is still not in production (Non operation mode initiated), as this will secure that the chip temperature will equal the liquid temperature established in the previous step. Then the voltage drop over the power device is determined by applying a predetermined current (Determine voltage). The most reliable result is obtained when the predetermined current is applied for a short time so that the temperature of the power chip is not increased. Subsequently, the power semiconductor is then again released for production (Release for production). Then the parameters of the model are established on basis of the relationship between the determined voltage and current and the established temperature (Establish parameters). These parameters are then used until the parameter process is repeated (Repeat). The temperature can now be estimated by use of a temperature model which uses the parameters. This is done by determining the voltage drop over the power device conducting a value of load current (Determine voltage and current). The values are used to estimate the temperature (Estimate temperature) based on the predetermined relationship between voltage, current and temperature, which is dependent on the established parameters.

Hence by making use of the temperature model and updating the parameters hereof it becomes possible to survey if there are any errors or inaccuracies introduced (e.g. from measuring circuit or semiconductor chip) during the life time of the power device. In a wind turbine application the temperature estimation can be used as a control parameter for the wind turbine. If the method includes the establishment of the parameters step, it can be done in non operation situations where the chip temperature is linked to the liquid cooling temperature as described above. These non operation intervals can be: service situations, when there is no wind, during lubrication sequence, cable unwinding, error on other components or a forced stop. During those non operation intervals the establishment of the parameters cycle may be executed. By cycle there is meant that the wind turbine control executes a program that establishes the parameters. In a typical wind turbine application, the wind turbine control system controls the power converter by means of start/stop signals and reference signals in addition to other signals. Depending on the configuration of the system, the liquid cooling system may be controlled by the power converter or by the Turbine Control system. Even though the cooling system may be controlled by the Wind Turbine Control system, there may still be a link to the power converter. This link may include measurements, safety signals etc.

Among other things, it is beneficial, in order to get a reliable temperature estimate, to have reference data for the actual power module and a measuring circuit suitable of making fast measurements during PWM switching. The reference data can be a combination of a general characterisation in a large temperature span on a single or few power modules in laboratory, in combination with specific measurements made for the actual power module installed in the wind turbine.

Typically a rotor is mechanical connected to a generator which converts the mechanical energy to electric energy. In order to be able to supply the utility grid with the electric energy it needs to be converted so that e.g. the frequency (and voltage and current) of the electric energy and the frequency on the utility grid is the same. This conversion is made by a converter more specifically by a plurality of power semiconductor devices comprised in the converter.

Figure 9:
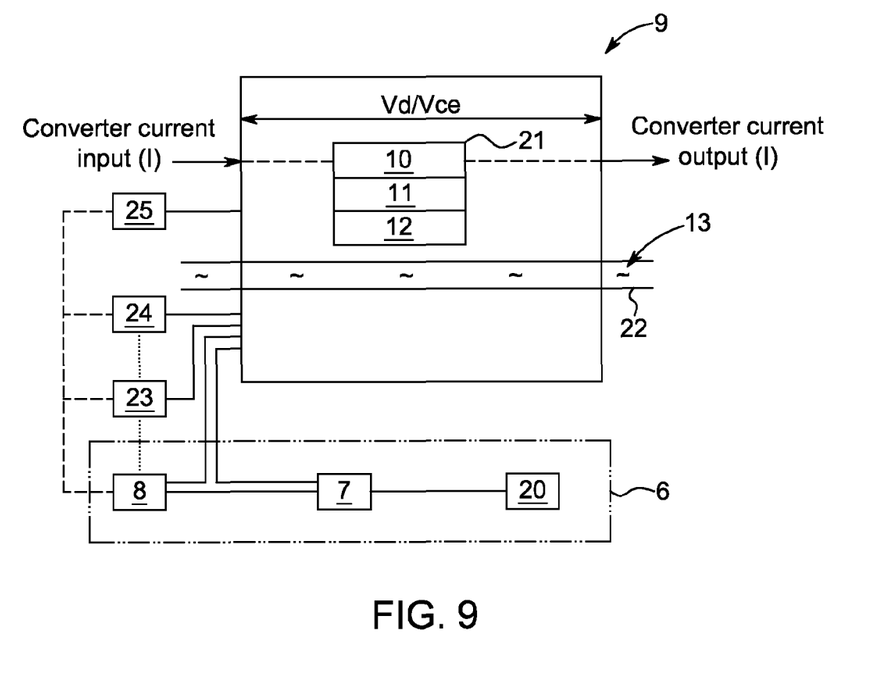

FIG. 9 illustrates an embodiment of the invention in a wind turbine application; hence FIG. 9 illustrates one power semiconductor device 9 of a converter (not shown). As mentioned above the semiconductor device 9 comprises one or more thermal stack(s) 21 each having a chip 10, insulation layer 11 and baseplate 12 in contact with a cooling liquid 13. The cooling liquid 13 may be part of a larger wind turbine cooling system 22.

The initial establishment of parameters for the temperature model (i.e. chip temperature, voltage drop, current, etc.) is acquired while the power semiconductor device 9 is not in operation e.g. by temperature sensor 25, calculation unit 23 and/or one or more measurement circuits 6. Such measuring circuit 6 may comprise a high voltage, low power semiconductor switch 7 (such as a FET as describe above) and an analog to digital converter 8. The FET 7 may be controlled by a gate drive 20.

When the parameters of the temperature model are established the semiconductor device 9 is ready for operation. The semiconductor device 9 may be controlled by a PWM signal from a gate drive (not shown). During operation of the semiconductor device 9 more specific at least in part of the parts of the PWM signal where the semiconductor device 9 conducting "its task" the FET 7 of the measuring circuit 6 is also on enabling the analog to digital converter 8 to measure the voltage drop. At the same time the load current through the semiconductor device 9 is measured by a current sensor (not illustrated).

A calculation unit 23 which preferably comprise a microprocessor or other means for processing data capable of execute the temperature model may then receive the measured data and based hereon estimates the chip temperature. The calculation unit 23 may be part of the converter control. The chip temperature may then be communicated to the converter control system and/or wind turbine controller 24 and used in the control the semiconductor power device 9 i.e. the converter of the wind turbine or other parts of the wind turbine.

It should be mentioned that the wind turbine controller 24 may at least partly control the converter i.e. the semiconductor device 9 and thereby the gate drive 20, the cooling system 22, calculation unit 23, generator (not shown), etc.

The invention claimed is:

1. Method for estimating the temperature of a semiconductor chip accommodated in a power semiconductor device in operation, the method comprising the steps of
while the power semiconductor device is in operation, by means of a measuring circuit, determining a voltage drop over the semiconductor chip for a value of applied load current and
estimating the temperature of the semiconductor chip by evaluating the relationship between the determined voltage drop and the value of applied load current on the basis of a temperature model,
wherein the temperature model comprises parameters for the relationship between the determined voltage drop and the determined applied load current, established by
establishing a temperature of the power semiconductor device when the power semiconductor device is not in operation, and
determining a voltage drop over the semiconductor chip for at least one predetermined current applied,
wherein at least one parameter of the temperature model is established a plurality of times during the lifetime of the power semiconductor device.

2. Method according to claim 1, wherein the chip temperature model describes an ideal diode, a thermistor or a combination of an ideal diode and a thermistor.

3. Method according to claim 1, wherein the chip temperature model is at least partly based on data established by tests.

4. Method according to claim 1, wherein the estimated temperature is used as basis for determining a derating factor for the load current handled by the power semiconductor device.

5. Method according to claim 1, wherein establishing the temperature is performed by determining the temperature of the semiconductor chip accommodated in the power semiconductor device and/or performed by heating the power semiconductor device to a predetermined temperature, and/or performed when the power semiconductor device is not in operation.

6. Method according to claim 1, wherein the power semiconductor device comprises one or more thermal stack, and wherein the power semiconductor device has not been in operation for at least five times a thermal time constant of the thermal stack, when the parameters of said semiconductor chip temperature model is established.

7. Method according to claim 1, wherein at least one predetermined current is applied for less time than 10% of the thermal time constant for the chip.

8. Method according to claim 1, wherein said power semiconductor device is an IGBT power module.

9. Method according to claim 3 wherein said tests are accelerated tests.

10. Apparatus for estimating the temperature of a semiconductor chip accommodated in a power semiconductor device in operation, comprising:
means for determining a voltage drop over the semiconductor chip for a value of applied current load while the power semiconductor device is in operation, and means for estimating the temperature of the semiconductor chip by evaluating the relationship between the determined voltage drop and the value of applied load current on the basis of a temperature model, wherein the temperature model comprises parameters for the relationship between the determined voltage drop and the determined applied load current, and the apparatus comprises a system for establishing the parameters of the temperature model, comprising:

means for establishing the temperature of the power semiconductor device while the power semiconductor device is not in operation, and means for determining the voltage drop over the semiconductor chip for at least one predetermined current applied, where the current is applied when the power semiconductor device is not in operation, wherein the system establishes at least one parameter of said temperature model a plurality of times during the life time of the power semiconductor device based on the relationship between the determined voltage drop, the determined applied current and the established temperature.

11. Apparatus according to claim 10, wherein the means for determining the voltage drop comprises a measuring circuit, which measuring circuit comprises a low power semiconductor device and at least one gate drive for the low power semiconductor device, wherein at least part of the circuit for determination of the voltage drop over the semiconductor chip is integrated in the gate drive.

12. Apparatus according to claim 10, wherein the means for establishing of the temperature heats the power semiconductor device to a predetermined temperature.

13. Wind turbine, comprising a power semiconductor device and an apparatus according to claim 10.

14. Wind turbine according to claim 13, comprising a liquid system in thermodynamic contact with the power semiconductor device, wherein the liquid system is configured for controlling the temperature of liquid in the liquid system.

15. Wind turbine according to claim 14, comprising a wind turbine control system operationally connected to a power converter, comprising the power semiconductor device and where the liquid system is operationally connected to the power converter.

16. Wind turbine according to claim 14, wherein the wind turbine control system is operationally connected to the liquid system.

17. Apparatus according to claim 10, wherein said power semiconductor device is an IGBT power module.

18. Apparatus according to claim 12, wherein said heating of the power semiconductor device to a predetermined temperature is configured to be provided by use of a liquid in thermodynamic contact with the power semiconductor device.

19. Wind turbine according to claim 14 comprising a heater suitable to heat the liquid to the desired temperature.

* * * * *